United States Patent [19]
Schwegler

[11] Patent Number: 5,594,623
[45] Date of Patent: Jan. 14, 1997

[54] METHOD AND APPARATUS FOR ATTACHING A HEAT SINK AND A FAN TO AN INTEGRATED CIRCUIT PACKAGE

[75] Inventor: Tim Schwegler, Pforzheim, Germany

[73] Assignee: Hewlett-Packard Co, Palo Alto, Calif.

[21] Appl. No.: 617,002

[22] Filed: Mar. 14, 1996

Related U.S. Application Data

[63] Continuation of Ser. No. 310,130, Sep. 21, 1994, abandoned.

[51] Int. Cl.$^6$ ............................................. H05K 7/20
[52] U.S. Cl. ..................... 361/697; 165/80.2; 165/80.3; 165/185; 174/16.3; 257/707; 361/710; 361/719
[58] Field of Search ................. 165/80.2, 80.3, 165/122, 185; 174/16.3; 257/704–707, 712–713, 718–719, 726–727, 731; 361/688, 690–695, 697, 704–710, 714–722

[56] References Cited

U.S. PATENT DOCUMENTS

| | | | |
|---|---|---|---|
| 4,022,272 | 5/1977 | Miller | 165/185 |
| 5,168,926 | 12/1992 | Watson et al. | 165/185 |
| 5,309,983 | 5/1994 | Bailey | 174/16.3 |
| 5,313,099 | 5/1994 | Tata et al. | 257/717 |
| 5,335,722 | 8/1994 | Wu | 361/697 |
| 5,353,193 | 10/1994 | Chia et al. | 361/690 |

FOREIGN PATENT DOCUMENTS

| | | | |
|---|---|---|---|
| 2246142 | 10/1990 | Japan | 361/690 |
| 94/19594 | 9/1994 | WIPO . | |

OTHER PUBLICATIONS

Vestrout, "Dendritic Heat Sink" IBM Tech. Disclosure Bulletin, vol. 22, No. 2, Jul. 1979, p. 536 (165/80.3).

AAVID Engineering, Inc., "Thermal Management Solutions for Pin Grid Array (PGA) and Quad Flat Pack (QFP) Packages", pp. 1–2, no known date.

Thermalloy, Apr. 1993; "New Heat Sink Spring Clips for use with AMP* Low Insertion Force PGA Sockets", pp. 1–3.

*Primary Examiner*—Gregory D. Thompson
*Attorney, Agent, or Firm*—Cynthia S. Baan

[57] ABSTRACT

An improved attachment method for attaching an heat sink to a integrated circuit package, which includes an heat spreader with a dove-tail feature attached to an upper surface of the integrated circuit package. The bottom surface of the heat sink has a dove-tail feature that matingly corresponds to the dove-tail feature of the heat spreader, such that the heat sink can be slide onto the heat spreader. The heat sink is prevented from sliding off of the heat spreader by a clip. A fan may be attached to the top surface of the heat sink using a clip that attaches to an outer edge of the heat sink or by making the outer two fins on the heat sink slightly taller than the fan with an inward dove-tail so that the fan can slide snugly between the top of the inner fins and the dove-tails of the outer two fins.

9 Claims, 17 Drawing Sheets

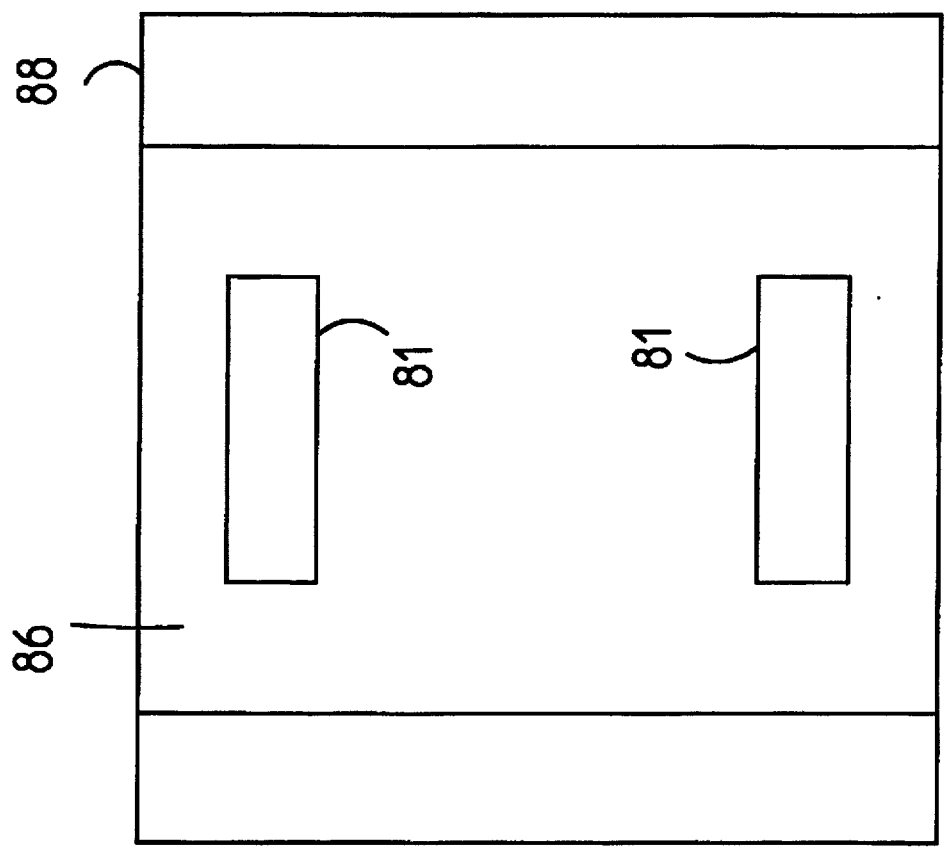

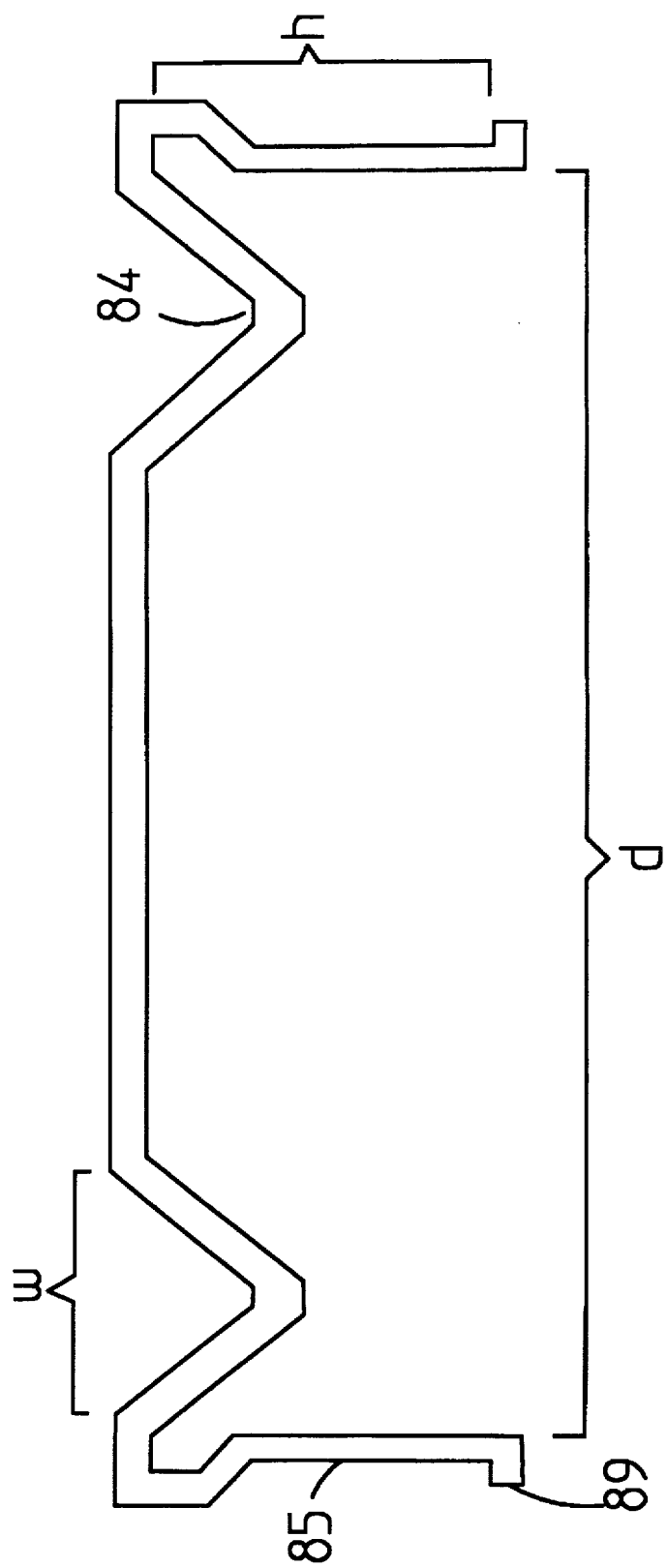

under shock or vibration. And

5,594,623

METHOD AND APPARATUS FOR ATTACHING A HEAT SINK AND A FAN TO AN INTEGRATED CIRCUIT PACKAGE

CROSS REFERENCE TO RELATED APPLICATIONS(S)

This is a continuation of application Ser. No. 08/310,130 filed on Sep. 21, 1994, now abandoned.

FIELD OF THE INVENTION

The present invention relates generally to the field of integrated circuit heat dissipation and more particularly to heat sinks and heat sink fans. In particular, this invention provides a method for attaching a heat sink to an integrated circuit package and a fan to a heat sink.

BACKGROUND OF THE INVENTION

Generally, heat sinks are mounted to an outer surface of an integrated circuit (I.C.) package to facilitate the removal of heat from the integrated circuit contained therein. Most heats sinks are thermally conductive and have a plurality of fins to provide a large surface area, which allows heat to be more efficiently dissipated by natural or forced air flow. Heat sinks are connected to I.C. packages in a variety of methods.

For example, a heat sink may be attached to an I.C. package with a sheet of thermally conductive adhesive film, which is placed between the flat surface of the package and the heat sink. The adhesive film is then heated while the package and heat sink are pressed together, thereby bonding the package and the heat sink together. Such a solution is relatively inexpensive, fills any air pockets between the two surfaces, and requires few design restrictions of the package or heat sink other than size and shape conformity. The drawbacks to such a solution include reduced thermal conductivity and migration of the adhesive film over time. Also, different thermal expansion ratios of the heat sink and the package cause mechanical stress on the package. This stress in combination with the curing and hardening required to form the bond leads to decreased mechanical stability. Thus, the heat sink may become loose under shock or vibration. Another drawback to this method is that when the I.C. goes bad or is replaced, the heat sink must be scrapped with the I.C.

Another heat sink attachment method is to add a stud to the heat spreader on the I.C. package and to screw the heat sink to the package using a nut and washer. This method requires a through hole in the heat sink. This method of attachment offers a high compression force between the mating surfaces, thus offering good thermal conductivity. The stud or screw are reliable under shock or vibration. And there is no migration of the fastener over time. However, the assembly torque process results in high stress to both plastic and ceramic packages. This is generally considered one of the most expensive attachment methods due to the secondary operations required in the manufacture of both the heat spreader and the heat sink to construct the stud and through hole. Also, the assembly process requires greater quality control to prevent and catch cracked packages.

There are also a variety of different methods known to attach heat sinks to packages by means of clamps or other equivalent spring loaded systems. The clamps are generally a wire or a sheet metal part made of semi-hard or spring hard materials. The force to ensure the thermal conductivity is provided by the spring load of the clamp. These systems are normally easy and inexpensive methods of attaching a heat sink to a package with very little process control or tools required for attachment. However, each package must have a special clamp designed to match its size and shape. And some solutions require either specially designed packages or printed circuit boards or both. Moreover, the force of each clamp is limited, thus limiting the thermal conductivity obtained. Also, not all solutions ensure a reliable attachment.

With regards to fan heat sink assemblies, typically this assembly is accomplished using screws to attach the fan to the heat sink. This method is expensive because the heat sink must be custom designed with four threads, usually between the fins in either of the four corners, to accommodate assembly with screws through the standard mounting holes on the four corners of the fan. Adding the threads to the heat sink is a very expensive process. Thus, if a heat sink requires special design to fit the particular size and shape of the package to be attached to (i.e. flat heat sink for thermal adhesive bond, through hole or screw for screw/nut fastening, or clamps and hinges for clamp or spring attachment, etc.) and special design depending on whether or not a fan will be attached to it, the slug or heat spreader requires special design depending on the method of attachment and the size of the package, and the package/printed circuit board requires special design depending on the type of heat sink/fan assembly—suddenly the simple task of heat dissipation becomes extremely expensive and design intensive. Accordingly, a simple, inexpensive method of heat sink/fan assembly attachment is needed, which is more standardized without sacrificing the heat dissipation ability of the system.

SUMMARY OF THE INVENTION

It is an aspect of the present invention to provide an improved, inexpensive and reliable method of attaching a heat sink to an integrated circuit package.

It is another aspect of the present invention to provide a more standardized method for attaching a heat sink to an integrated circuit package that does not require either the heat sink, the printed circuit board, or the integrated circuit package to be specially designed.

It is a further aspect of the present invention to provide a method of attaching a heat sink to an integrated circuit package that places little or no stress on the integrated circuit package.

It is a further aspect of the present invention to provide a method of attaching a heat sink to an integrated circuit package that allows for heat sinks to be exchanged or reused.

It is a further aspect of the present invention to provide an improved, inexpensive and reliable method of attaching a fan to a heat sink.

It is yet a further aspect of the present invention to provide a more standardized method for attaching a fan to a heat sink.

The above and other aspects of the present invention are accomplished by attaching a dove-tail heat spreader to the top surface of an integrated circuit package. The dove-tail of the heat spreader matingly corresponds to a dove-tail on the bottom side of a heat sink. Accordingly, the heat sink is slid onto the heat spreader and a clip is fastened over the heat sink to prevent it from sliding off of the heat spreader. The size of the heat spreader and the dove-tail design of the heat sink can be standardized to allow for ease of reuse and exchange of heat sinks. Also, the dove-tail of the heat spreader and the dove-tail of the heat sink absorb the stress of mounting the heat sink to the package, thus relieving the package of most of the stress. A fan may be attached to the heat sink using a clip that snaps on to the outer contour of the heat sink or by making the outer two fins on the heat sink slightly taller than the fan with an inward dove-tail so that the fan can slide snugly between the top of the inner fins and the dove-tails of the outer two fins.

BRIEF DESCRIPTION OF DRAWINGS

The above and other objects, features and advantages of the present invention will be better understood by reading the following more particular description of the invention, presented in conjunction with the following drawings, wherein:

FIG. 7C shows a bottom view of a heat sink according to the fourth embodiment of the present invention;

FIG. 8B shows a side view of a heat sink clip according to the fourth embodiment of the present invention;

DETAILED DESCRIPTION OF THE PREFERRED EMBODIMENT

Figure 1:
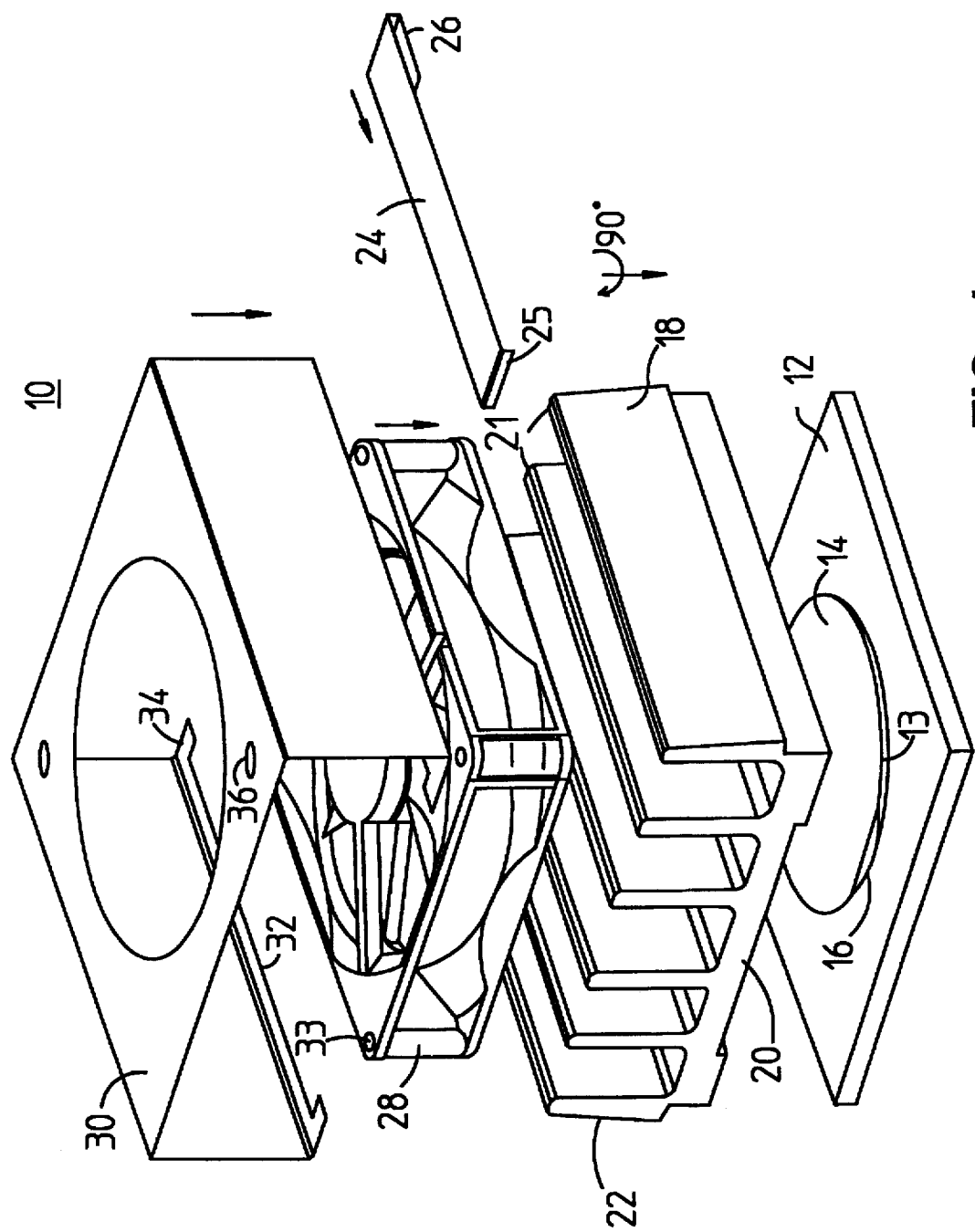
FIG. 1 shows a top perspective view of a heat dissipation system according to the present invention.
Figure 2A:
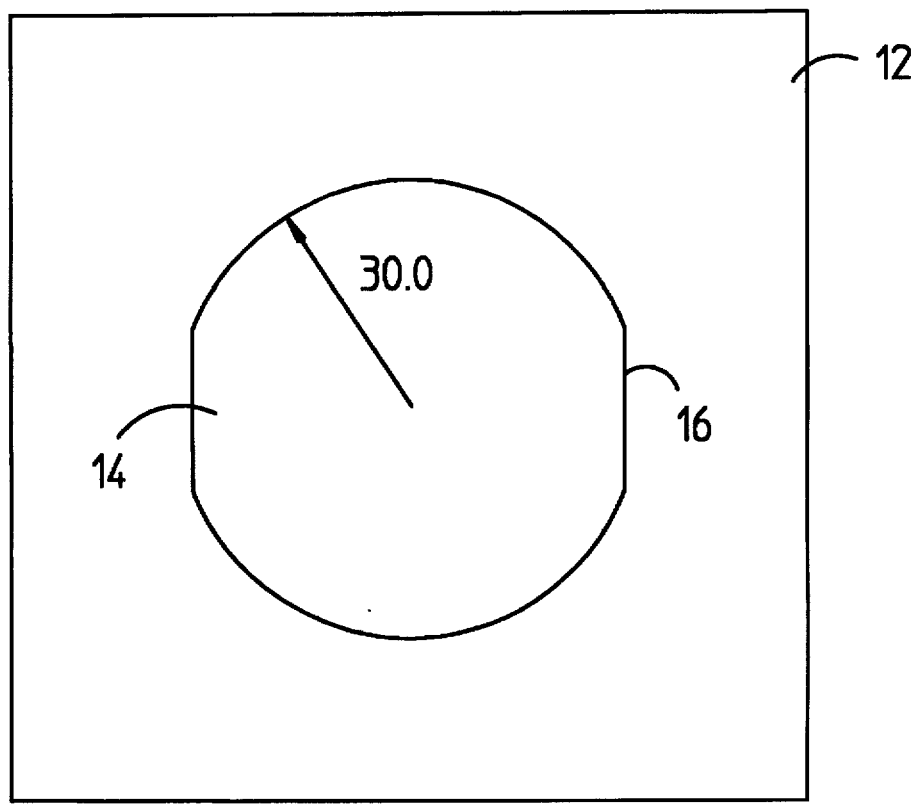
FIG. 2A shows a top view of a heat spreader according to a first embodiment of the present invention.
Figure 2B:
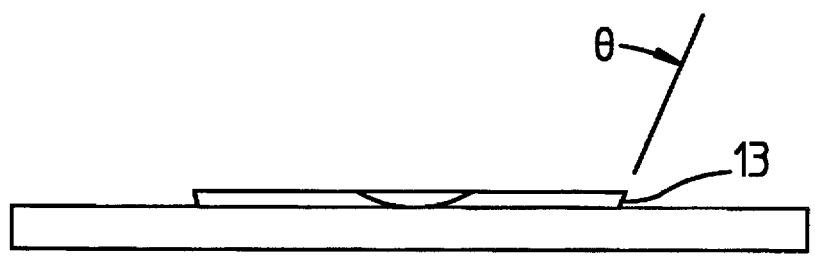
FIG. 2B shows a side view of a heat spreader according to the first embodiment of the present invention.

Referring to the drawings more particularly by reference number, FIG. 1 shows the general heat dissipation system 10 according to the present invention. The heat dissipation system 10 is typically constructed of a heat spreader 14 soldered or glued to a top surface of an integrated circuit package 12, a heat sink 18 is mounted on the heat spreader 14 with a twisting movement and secured against movement with a first clip 24, and a fan 28 is mounted on the heat sink 14 and secured to the heat sink with a second clip 30. Referring now to FIGS. 1, 2A and 2B, heat spreader 14 is a substantially flat circular slug of approximately 1.5 mm, preferably made of copper or copper tungsten with a top diameter of approximately 30.0 mm. Heat spreader 14 has a bevelled or dove-tail edge 13 between the top and bottom surfaces. The angle of the dove-tail edge 13 can be any angle θ from approximately 45° to 60°. Two sides 16 of heat spreader 14 are flat with the distance between the two flat sides 16 being approximately 28.0 mm. The two flat sides 16 are parallel to each other. Although copper or copper tungsten is preferred, any thermally conductive material that is neither brittle nor malleable may be used for the heat spreader.

Figure 3A:
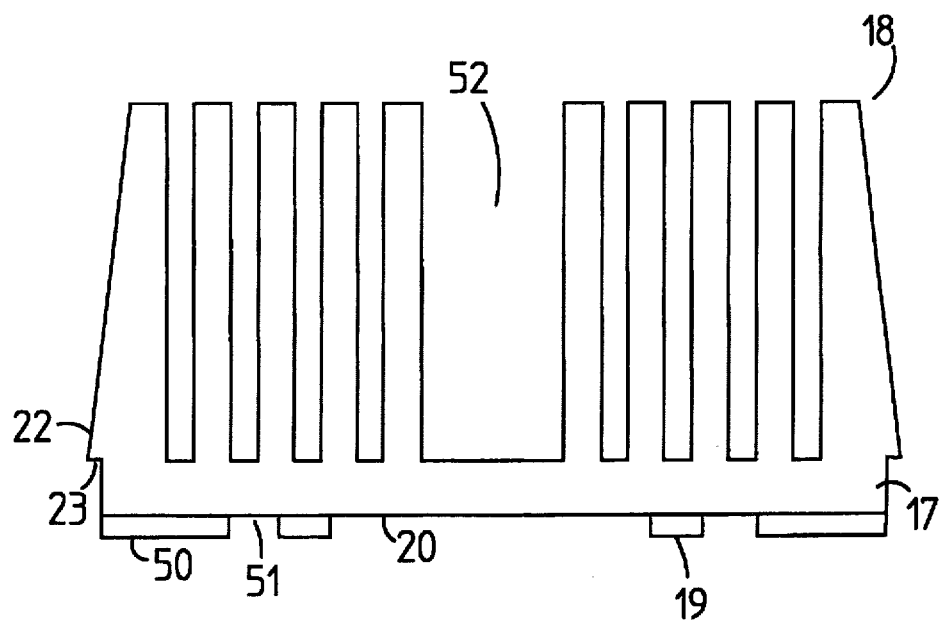
FIG. 3A shows a side view of a heat sink according to the first embodiment of the present invention.
Figure 3B:
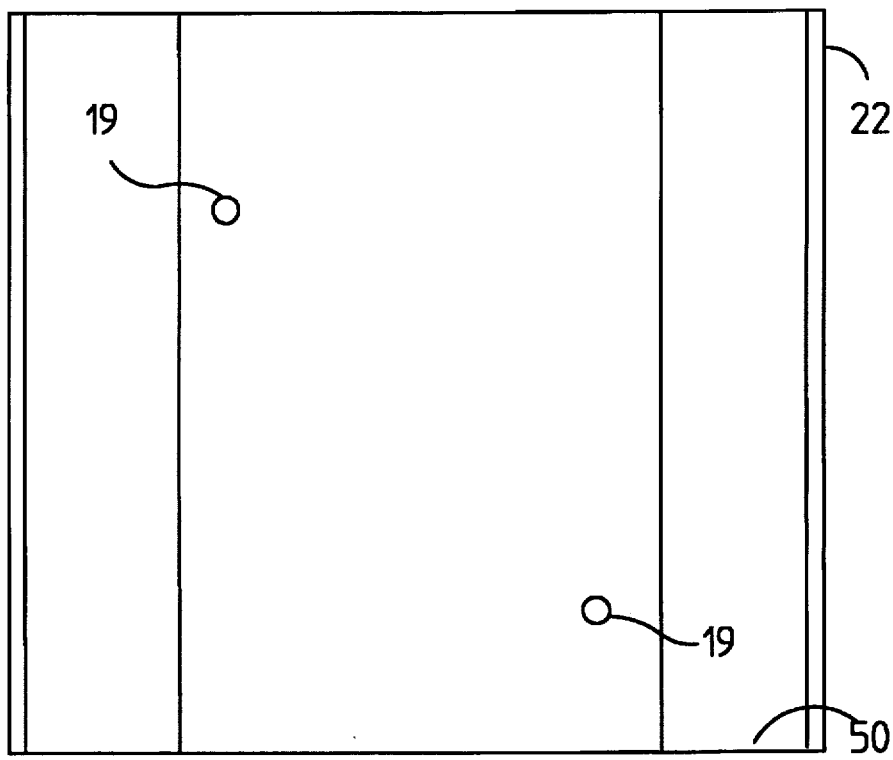
FIG. 3B shows a bottom view of the heat sink according to the first embodiment of the present invention.

Referring now the FIGS. 1, 3A and 3B, heat sink 18 is constructed of a light weight, thermally conductive material, typically aluminum. Heat sink 18 has a plate 17 which has approximately the same foot print as I.C. package 12. Fins 21 extend from a first surface of plate 17, providing a large surface area for heat transfer. A ramp 22 with an under cut edge 23 is cut on either outer fin of the heat sink, which is used to hold a second clip 30 (See FIG. 4A–C and explanation). The ramp 22 is cut in the direction of the extrusion of the fins. A flat area 20 is cut in the bottom of plate 17 with 45° to 60° slanted or dove-tail inner side walls 51 on outer struts 50 in the direction of the extrusion of the fins. The narrowest distance between parallel side walls 51 is just slightly wider than the width between the two flat sides 16 of the heat spreader 14 and the widest distance between side walls 51 (i.e. near plate 17) is just slightly wider than the diameter of heat spreader 14 (i.e. 30.0 mm). Accordingly, heat sink 18 is mounted in heat spreader 14 by lowering the heat sink 18 onto the top of the heat spreader 14 such that dove-tailed side walls 51 of the outer struts 50 are on either side of the two flat sides 16 heat spreader 14. The heat sink is then twisted 90 degrees so that the dove-tailed side walls 51 of the heat sink 18 are interlocked with the dove-tail 13 of the heat spreader 14. The extruded flat area 20 of the heat sink 18 may be bowed slightly in the direction of the extrusion to ensure a tighter fit between the heat sink 18 and the heat spreader 14, thus preventing sliding caused by vibrations and to ensure a better thermal contact for heat dissipation. Also, two plugs 19 can be semipierced, riveted, soldered, screwed or otherwise secured to the flat area 20 on the bottom of heat sink 18 to prevent heat sink 18 from sliding off of the heat spreader 14 in the direction of the extrusion. Plugs 19 are placed at diagonally opposite sides of flat area 20 such that the distance between plugs 19 is just slightly wider than heat spreader 14 (i.e. 30 mm) so that when the heat sink 18 is lowered onto the heat spreader 14, it just fits between struts 50 and plugs 19 and is then twisted 90 degrees into its interlocked position.

In order to prevent heat sink 18 from twisting back to the demounting position, once it is in the interlocked position, a first clip 24 (shown in FIG. 1) is positioned in an opening 52 between the fins 21 such that hook 26 of clip 24 slides under plate 17 and abuts one of the flat edges 16 of heat spreader 14 and end 25 of clip 24 clips over the opposite end of plate 17. Hook 26 abutting one of the flat edges 16 of heat spreader 14 prevents heat sink 18 from twisting to the demounting position under vibration. First clip 24 is preferably made of stainless steel, copper beryllium or any other spring hard material.

Referring now to FIGS. 1 and 4A–C, a typical fan 28, such as a 5 or 12 V fan manufactured by Sunon, Aavid Electronics, or Heatsink Mfg., is secured to the top of heat sink 18 with a second clip 30 which has two flanges 32 on opposite sides of the clip 30. Each flange 32 has two tabs 34, one at either end. Clip 30 slides over heat sink 18 and is forced open by ramps 22 on the outer fins 21 until flanges 32 catch over under cut edges 23 of ramp 22. Second clip 30 is prevented from sliding off of heat sink 18 by tabs 34 which wrap around the outside of heat sink 18. Second clip 30 is approximately 49.0 mm by 52.8 mm with sidewalls 37 being approximately 38.1 mm, fan opening 39 being approximately 40.0 mm in diameter, flanges 32 being approximately 1.7 mm, and tabs 34 being approximately 1.3 mm by 1.3 mm. Clip 30 is preloaded by bending sidewalls 37 and flanges 32 a few degrees past 90 degrees. Clip 30 is preferably made of stainless steel, copper beryllium or any other spring hard material.

Figure 4A:
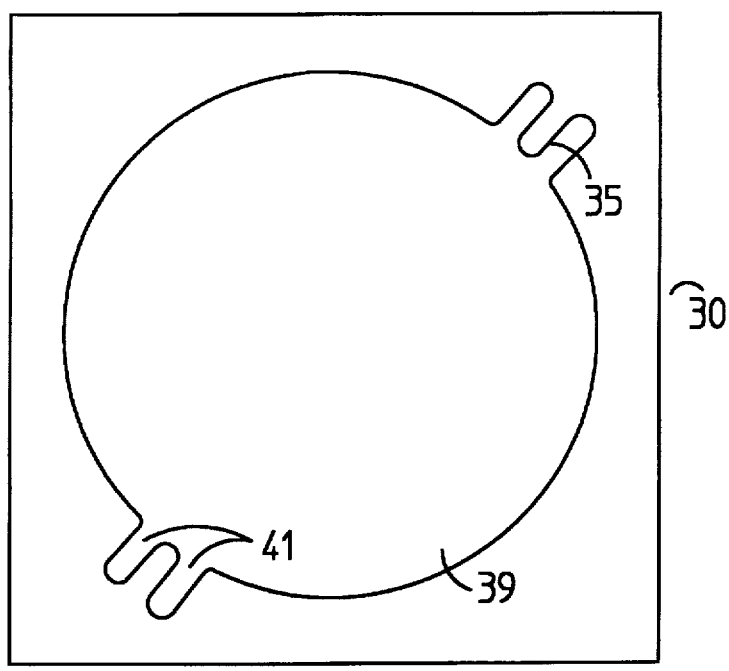
FIG. 4A shows a top view of a fan clip according to the first embodiment of the present invention.
Figure 4B:
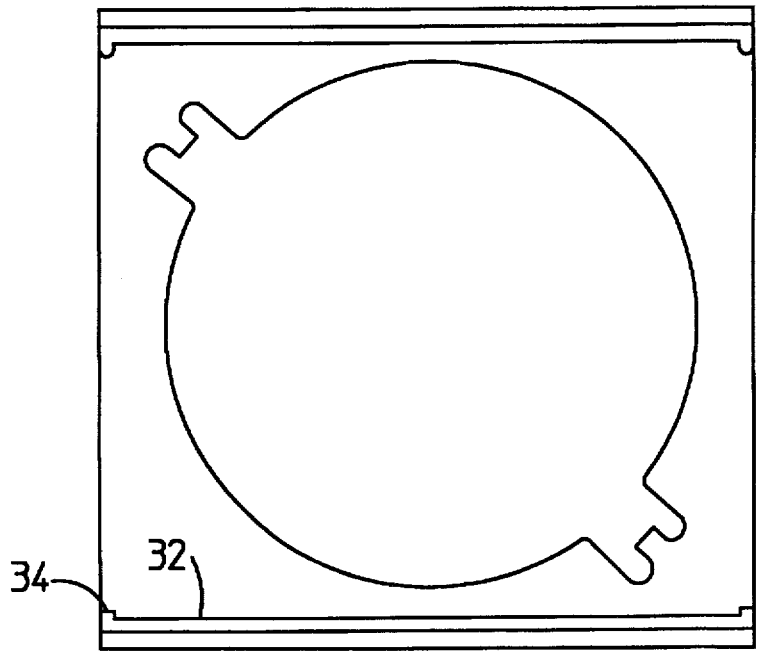
FIG. 4B shows a bottom view of a fan clip according to the first embodiment of the present invention.
Figure 4C:
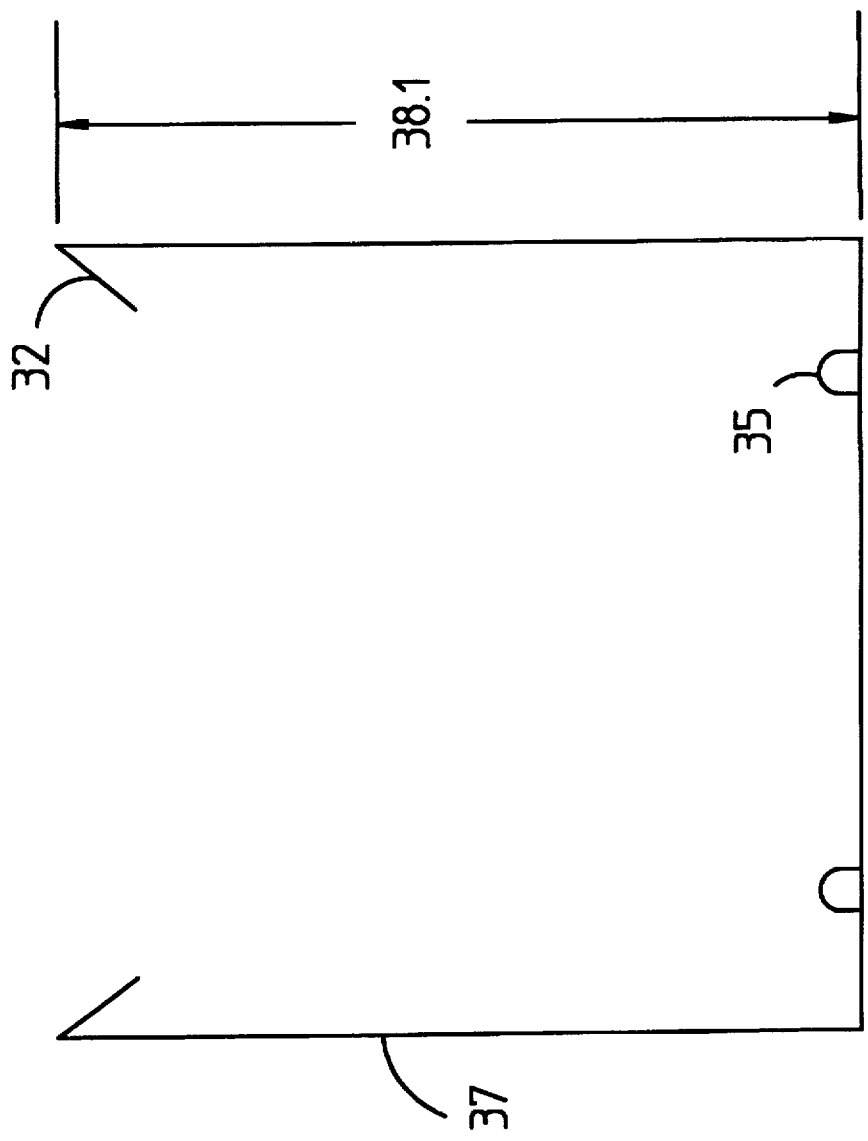
FIG. 4C shows a side view of a fan clip according to the first embodiment of the present invention.

In order to prevent fan 28 from sliding off of heat sink 18, plugs 36 (shown in FIG. 1) are semipierced, riveted, screwed, soldered or otherwise secured to clip 30 at predetermined position such that plugs 36 matingly correspond to two or more of the pre-existing through holes in fan 28. FIGS. 4A–C show tabs 35 which are formed by stamping out fan opening 39 and notches 41 on either side of tabs 35, instead of semipiercing plugs 36 (as shown in FIG. 1) to correspond with fan through holes 33. After the dimensions of clip 30 are stamped out, then tabs 35 can be bent 90 degrees inward, sidewalls 37 can be bent inward a few degrees past 90 degrees, and flanges 32 can be bent inward a few degrees past 90 degrees. Although dimensions have been given for heat spreader 14, cut-out flat area 20, first clip 24 and second clip 30, it will be readily evident to those in the field that these dimensions may change depending on the size of (1) the package 12 being used, (2) the size of heat sink 18 required to accomplish the necessary cooling, (3) the size and shape of the fan 28 being used, and (4) the position, size and shape of fan through holes 33. It should also be noted that for proper air flow, second clip 30 should be attached to heat sink 18 in such a manner as to allow air to flow between fins 21 and away from the heat sink 18, i.e. sidewalls 37 of clip 30 do not block air flow.

Figure 5B:
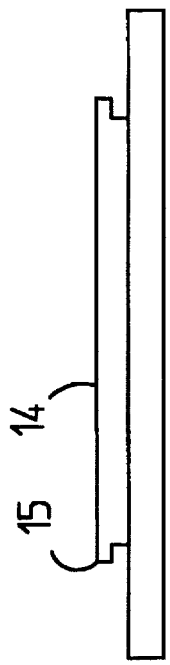
FIG. 5B shows a side view of a heat spreader according to the second embodiment of the present invention.
Figure 5A:
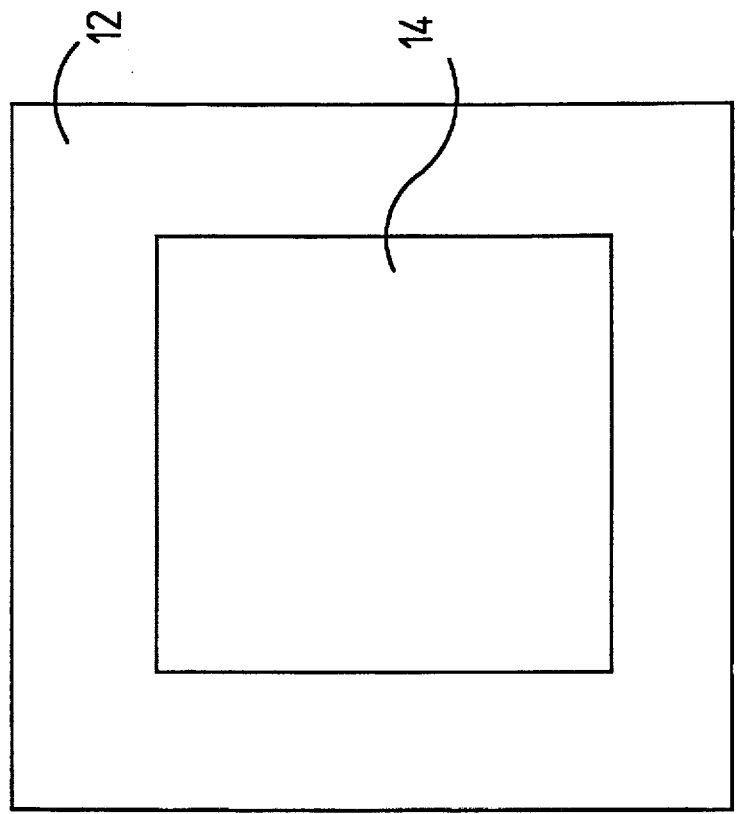
FIG. 5A shows a top view of a heat spreader according to a second embodiment of the present invention.
Figure 5C:
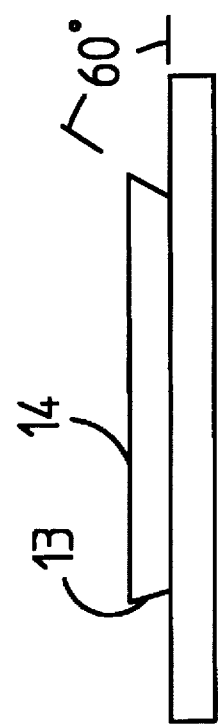
FIG. 5C shows a side view of a heat spreader according to a third embodiment of the present invention.

Referring now to FIGS. 1 and 5A–5C, a second embodiment for heat spreader 14 is shown. Specifically, heat spreader 14 can be square rather than round. Heat spreader 14 can also have a ledge 15 (as shown in FIG. 5B) that is approximately 1.2 mm wide by 0.8 mm thick along two to four sides rather than a dove-tail or bevelled edge (as shown in FIG. 5C). If a square heat spreader is used, rotation is not a problem, so plugs 19 are not necessary. However, the first clip 24 must be designed to prevent the heat sink 18 from sliding off on either side of cut-out flat area 20. Another option is to place one plug 19 on heat sink 18 such that the heat sink 18 will slide onto heat spreader 14 until the one plug 19 is reached and then first clip 24 is used to prevent heat sink 18 from sliding off in the direction that it was slid into place.

Figure 6A:
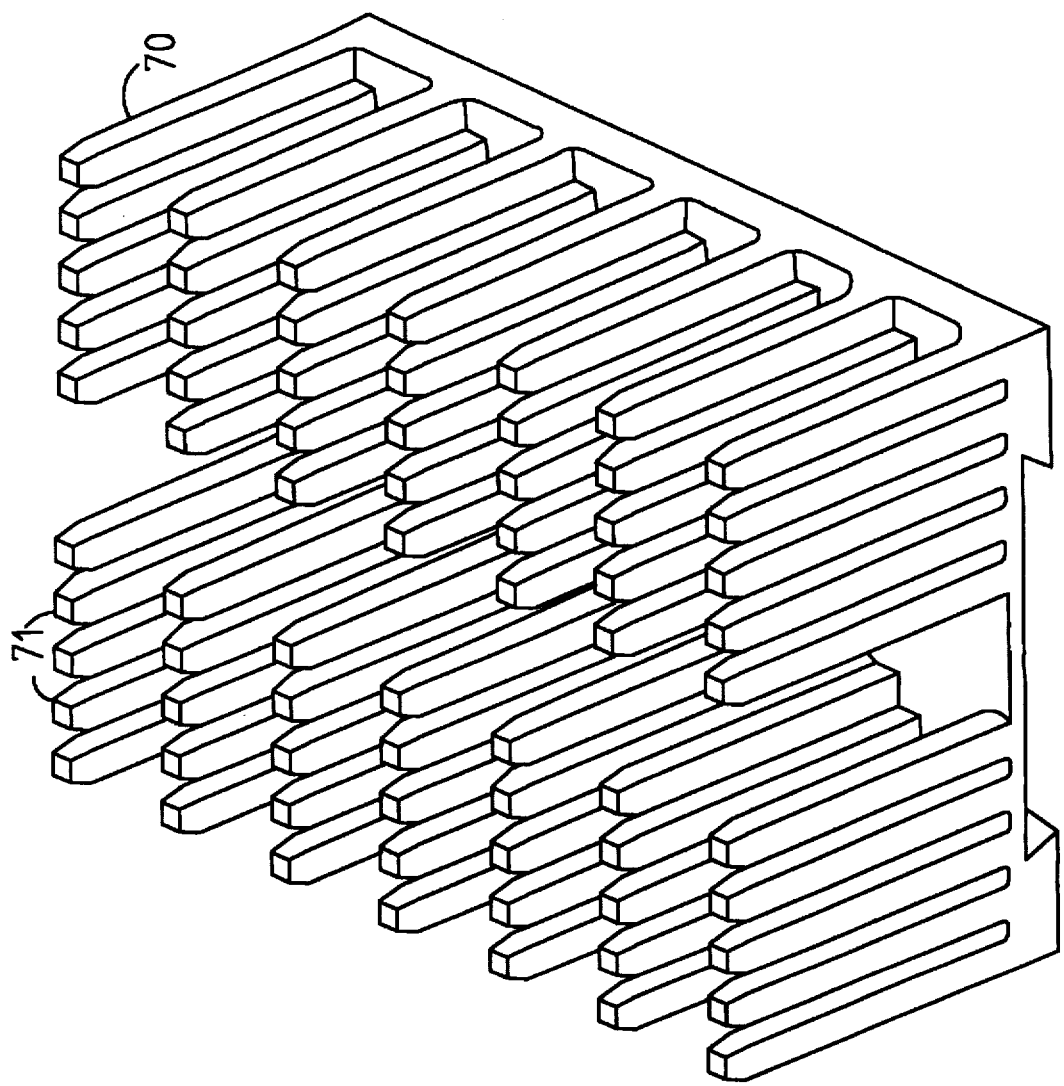
FIG. 6A shows a top perspective view of a heat sink according to the second and third embodiments of the present invention.
Figure 6B:
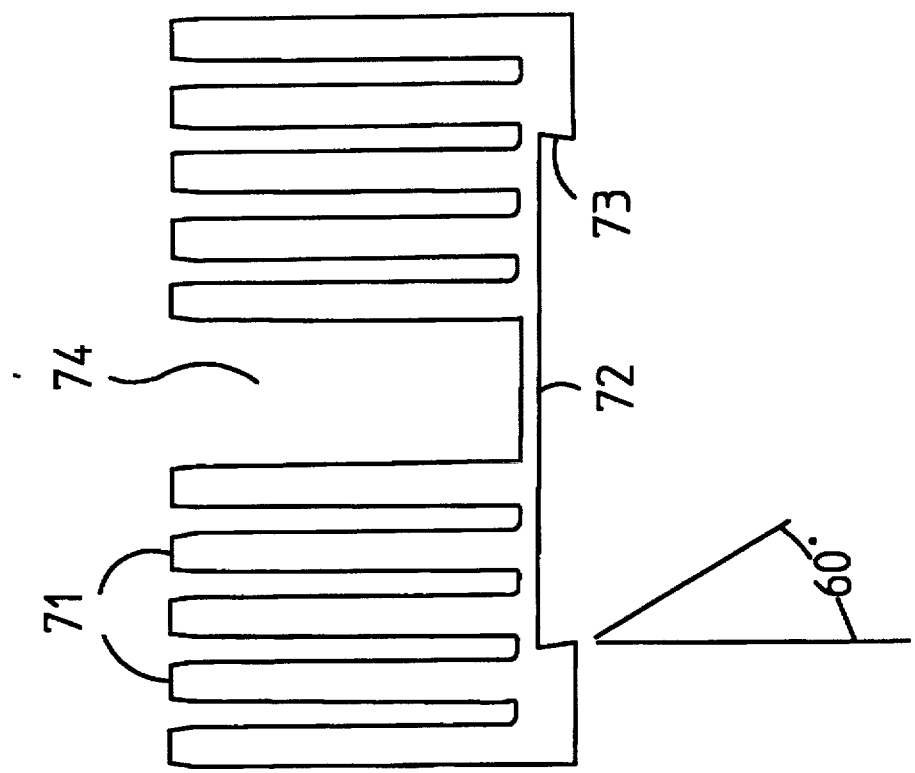
FIG. 6B shows a side view of a heat sink according to the second and third embodiments of the present invention.
Figure 7A:
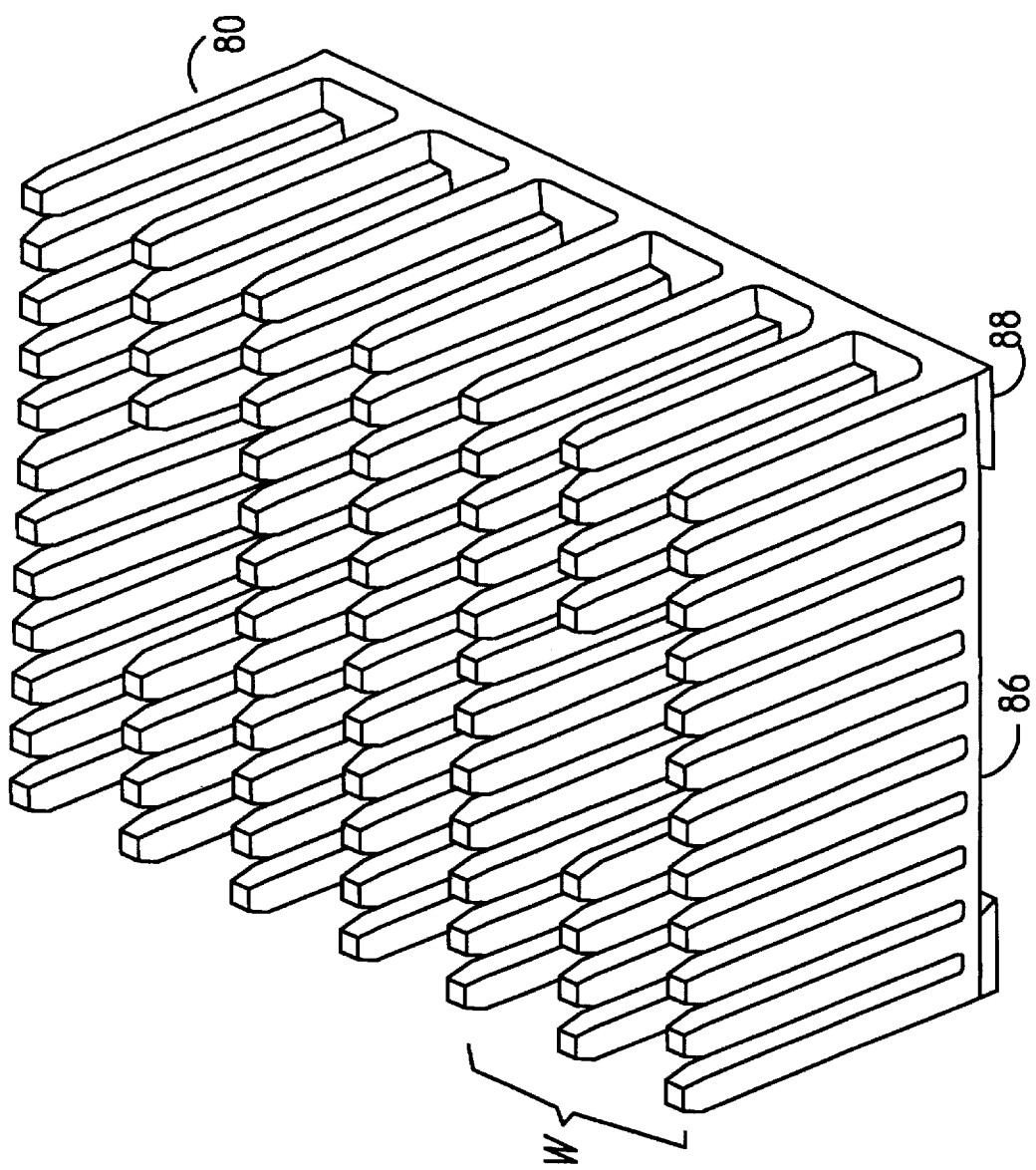
FIG. 7A shows a top perspective view of a heat sink according to a fourth embodiment of the present invention.
Figure 7B:
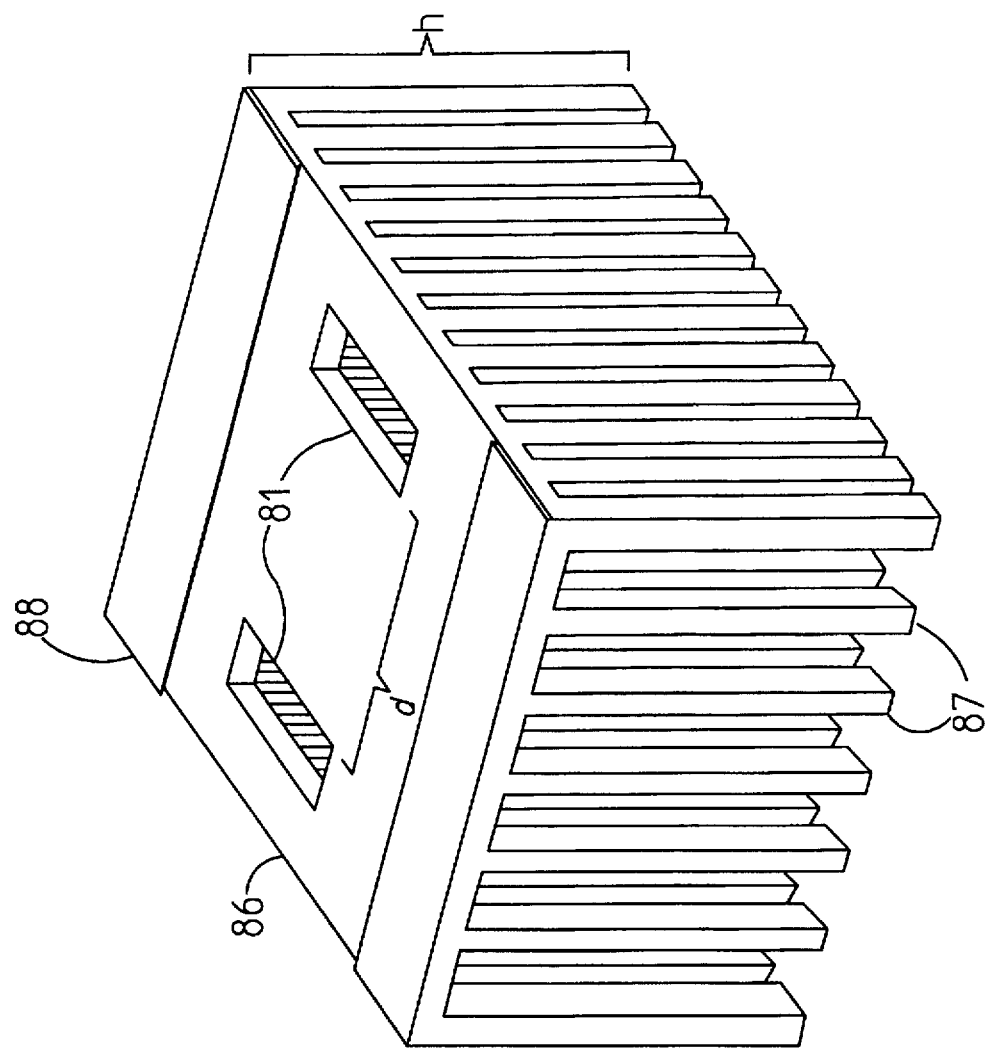
FIG. 7B shows a bottom perspective view of a heat sink according to the fourth embodiment of the present invention.
Figure 8A:
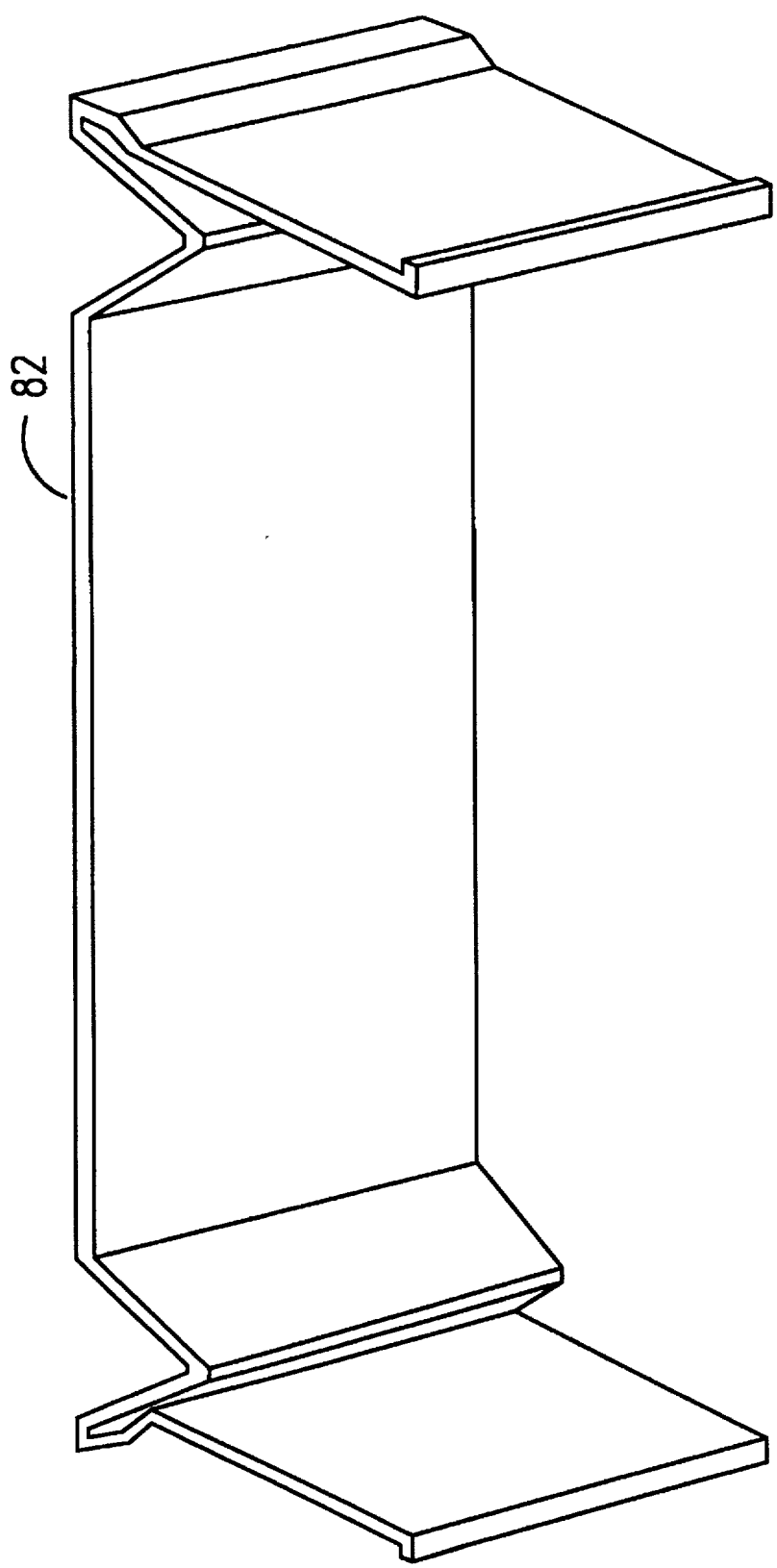
FIG. 8A shows a side perspective view of a heat sink clip according to the fourth embodiment of the present invention.
Figure 9A:
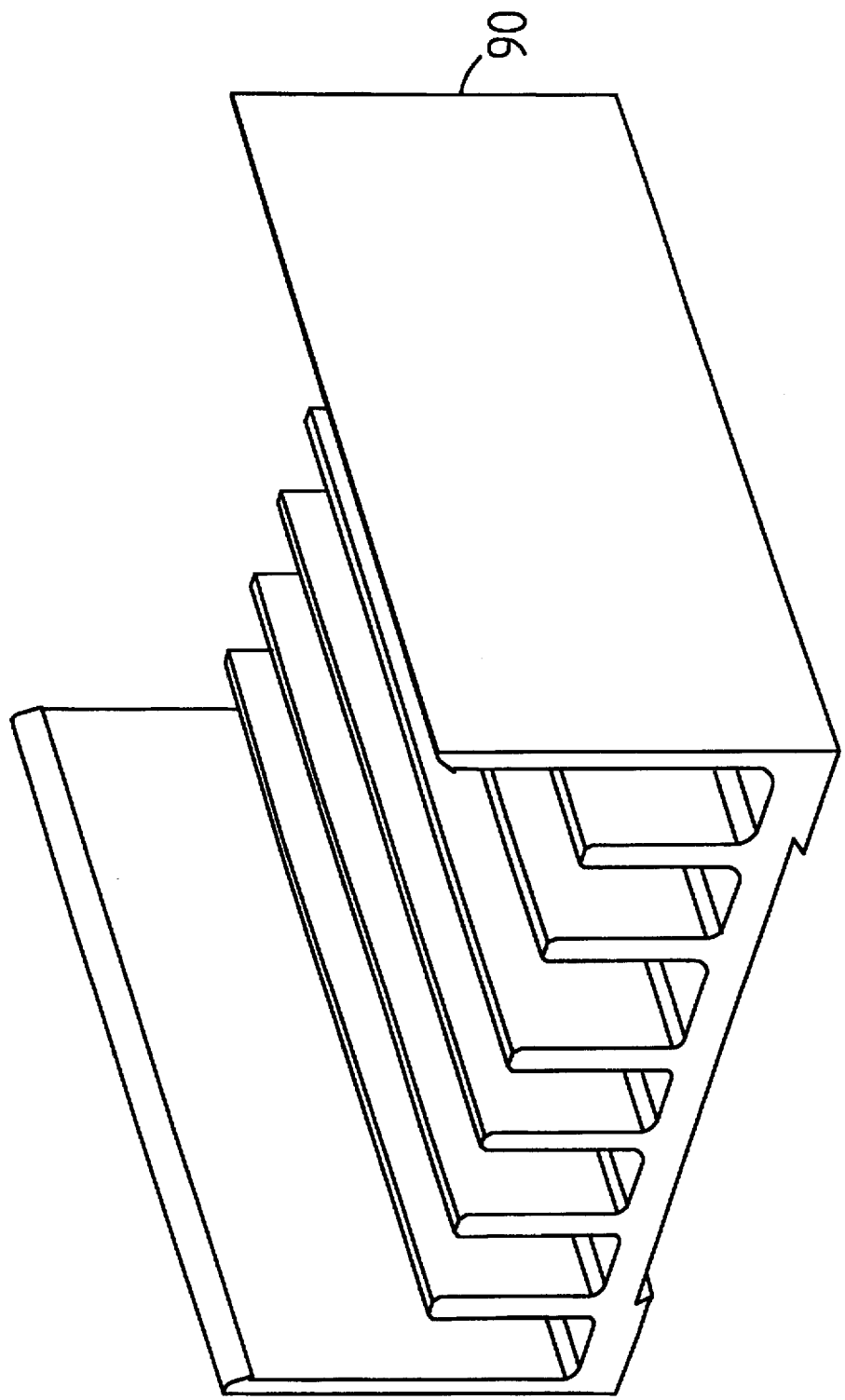
FIG. 9A shows a top perspective view of a heat sink according to a fifth embodiment of the present invention.
Figure 9B:
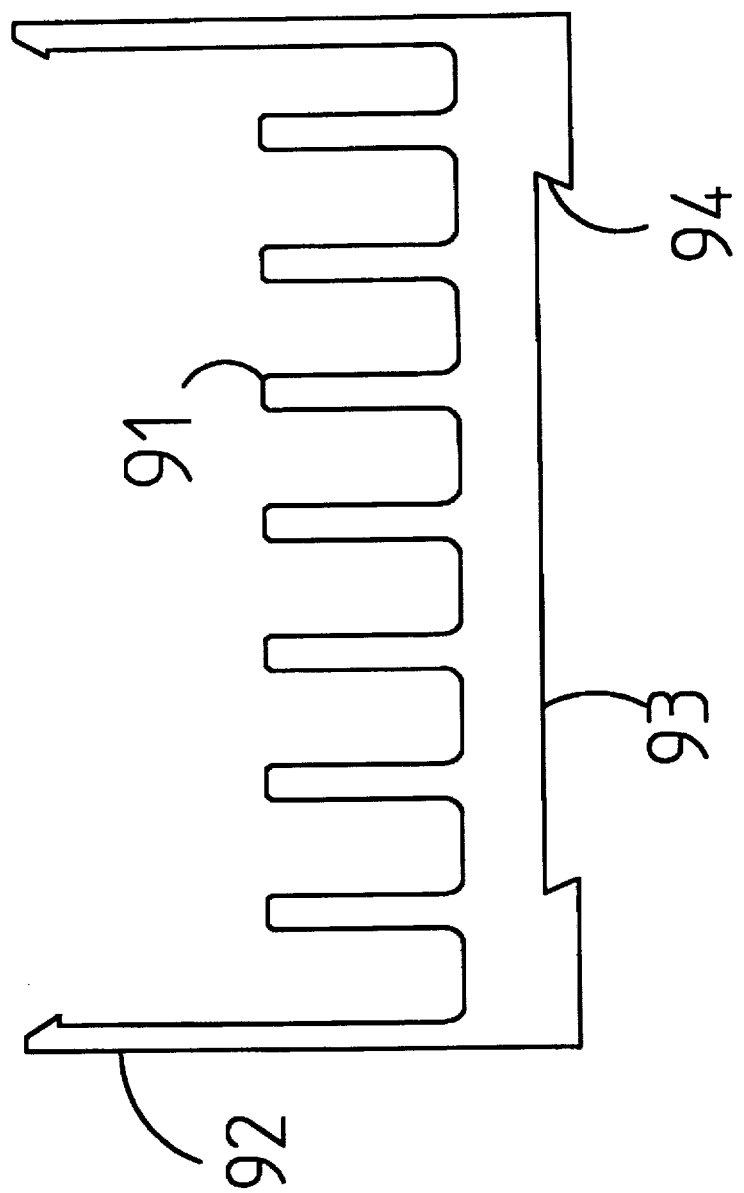
FIG. 9B shows a side view of a heat sink according to the fifth embodiment of the present invention.
Figure 9C:
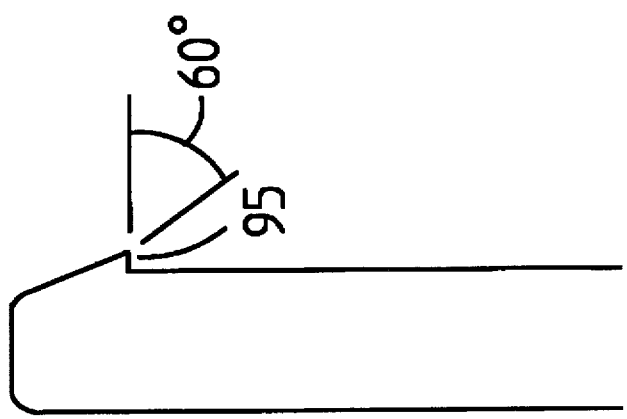
FIG. 9C shows a blown-up side view of an outer fin of the heat sink according to the fifth embodiment of the present invention.

Referring now to FIGS. 1 and 6A–6B, a heat sink 70 according to a third embodiment of the present invention is shown. Heat sink 70 shows pins 71 that are approximately 22.1 mm in height, attached to a plate 72 that is approximately 1.9 mm thick, which has two dove-tail features 73 that are approximately 1.5 mm thick. Heat sink 70 has a central portion 74 that does not have any pins, so that first clip 24 can be mounted between pins 71. Heat sink 70 is made of any cheap, light weight, thermally conductive material, such as aluminum. Central portion 74 is in the same direction as the extrusion for dove-tails 73. Another option is not to extrude central portion 74, to leave first clip 24 off, and to design second clip 30 to fit over heat sink 70 in such a manner that flanges 32 of clip 30 fit between dove-tails 73. Thus, clip 30 would secure fan 28 to heat sink 70 and secure heat sink 70 against sliding off of heat spreader 14. This design would be possible because heat sink 70 has pins 71, allowing air to flow in more directions than heat sink 18 would allow, thus, sidewalls 36 of clip 30 would not block the air flow if they (sidewalls 36) were perpendicular to the direction of dove-tails 73, which would not be the case for heat sink 18. It should again be noted that the dimensions of heat sink 70 and clip 24 may change to correspond to the size and shape of the package 12 used, the heat dissipation requirements, etc.

Referring now to FIGS. 1, 7A–7C and 8A–8B a heat sink 80 and a third clip 82, according to a fourth embodiment of the present invention, are shown. Heat sink 80 is similar to heat sink 70 with the additional feature of holes 83, which are punched out of heat sink 80. The distance D between holes 81 should be slightly greater than heat spreader 14 and equal to the distance D between the prongs 85 of clip 82. The height H of heat sink 80 from the plate 86 to the end of pins 87 (not including dove-tails 88) is equal to the height H of prongs 85 of clip 82. The width W between the pins 87 on either side of the holes 81 of heat sink 80 is equal to the width W of holes 81 on clip 82. In use, heat sink 80 is slid onto heat spreader 14 in such a manner that dove-tail 88 of heat sink 80 is locked with dove-tail 13 of heat spreader 14. Then the prongs 85 of clip 82 are lowered between pins 87 and into holes 81 until lip 89 of prong 85 catches under plate 86 of heat sink 80. In this manner, clip 82 prevents heat sink 80 from sliding off of heat spreader 14 with prongs 85 locked on either side of heat spreader 14 and preventing any movement or twisting. Heat sink 80 is made of any cheap, light weight, thermally conductive material, such as aluminum. Clip 82 is preferably made of stainless steel, copper beryllium or any other spring hard material.

Referring now to FIGS. 1 and 9A–9C, a heat sink 90 shown accordingly to a fifth embodiment of the present invention. Heat sink 90 has inner fins 91, which are approximately 1.5 mm thick and spaced approximately every 5.2 mm along plate 93. Heat sink 90 also has outer fins 92, which have a ledge 95 that is in the direction of extrusion of the fins and is approximately 10.5 mm taller than inner fins 91 and are spaced approximately 40.0 mm apart. Ledge 95 is approximately 0.3 mm wider than outer fin 92. In practice, heat sink 90 is slid onto heat spreader 14 and secured with clip 24 between two inner fins 91 along plate 93. Then a fan 28 is slid onto heat sink 90 between inner fins 91 and ledge 95 of outer fins 92. As stated previously, dimensions may change to accommodate different sized packages 12 and fans 28 as long as the distance between inner fins 91 and ledge 95 of outer fins 92 is approximately equal to the height of fan 28, so that the fan fits snugly between inner fins 91 and ledge 95 and does not slide due to vibration.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A heat sink assembly for dissipating heat from an integrated circuit with a package, said heat sink assembly comprising:

a heat spreader having a first side and a second side with a dove-tailed edge running around a periphery of said heat spreader between said first side and said second side such that the area of said first side is smaller than the area of said second side, said first side of said heat spreader being attached to said integrated circuit package; and a heat sink with a first side and a second side, said first side having fins which dissipate heat extending from said first side, said second side having two substantially parallel outer struts with dove-tailed inner side walls that matingly correspond with the dove-tailed edge of the periphery of said heat spreader such that said heat sink can be slidingly mated to said heat spreader with the dove-tailed edge of said heat spreader and the dove-tailed inner side walls of said heat sink securing said heat sink to said integrated circuit package.

2. The heat sink assembly according to claim 1 wherein said heat spreader comprises a flat circular slug with a first side and a second side, said first side and said second side being substantially parallel said dove-tailed edge being along the periphery of said slug between said first side and said second side such that said first side of said slug has a smaller circumference than said second side, said first side of said slug being attached to said integrated circuit package.

3. The heat sink assembly according to claim 2 wherein said heat spreader includes two substantially parallel flat sides along the dove-tailed edge, said two substantially parallel flat sides being substantially perpendicular to said first side and said second side of said heat spreader and the dove-tailed inner sidewalls of said heat sink are just wider than the distance between said two substantially parallel flat sides of said heat spreader such that said heat sink is lowered onto said heat spreader with the substantially parallel outer struts of said heat sink on either side of said two substantially parallel flat sides of said heat spreader, said heat sink is then rotated until said dove-tailed inner side walls of said heat sink and said dove-tailed edge of said heat spreader are mated.

4. The heat sink assembly according to claim 3 wherein said heat sink includes two plugs that are attached to said second side of said heat sink between said substantially parallel outer struts, said two plugs being just wider than the diameter of said second side of said heat spreader, said two plugs securing said heat sink and said heat spreader against sliding movement after said heat sink and said heat spreader have been rotatingly mated.

5. The heat sink assembly according to claim 4 and further comprising a clip, said clip attached to said heat sink and at least one of said two substantially parallel flat sides of said heat spreader, said clip securing said heat sink and said heat spreader against rotational movement after said heat sink and said heat spreader have been rotatingly mated.

6. The heat sink assembly according to claim 5 and further comprising:

two ramps with undercuts on an outer surface of opposing outer fins of said heat sink;

a fan mounted on atop surface of said fins of said heat sink; and a second clip, said second clip securing said fan to said heat sink by attaching under said two undercuts of said opposing outer fins of said heat sink such that said fan is fixedly attached adjacent to said fins.

7. The heat sink assembly according to claim 5 wherein said heat sink includes two outer fins and a plurality of inner fins, said plurality of inner fins being of substantially the same height, said two outer fins being taller than said plurality of inner fins, each of said two outer fins having a ledge that faces toward said plurality of inner fins, said ledges of said outer fins being a predetermined height above said inner fins such that a fan may snugly slide between said inner fins and said ledges of said outer fins.

8. A heat sink assembly for dissipating heat from an integrated circuit with a package, said heat sink assembly comprising:

a heat spreader having a first side and a second side with a dove-tailed edge between said first side and said second side and running around the periphery of said heat spreader such that the area of said first side is smaller than the area of said second side, said first side of said heat spreader being attached to said integrated circuit package;

a heat sink with a first side and a second side, said first side having fins which dissipate heat extending from said first side, said second side having two substantially parallel outer struts with dove-tailed inner side walls that matingly correspond with the dove-tailed edge of the periphery of said heat spreader such that said heat sink can be slidingly mated to said heat spreader with the dove-tailed edge of said heat spreader and the dove-tailed inner side walls of said heat sink securing said heat sink to said integrated circuit package, said heat sink includes two plugs that are attached to said second side of said heat sink between said substantially parallel outer struts, said two plugs being just wider apart than the diameter of said second side of said heat spreader, said two plugs securing said heat sink and said heat spreader against sliding movement after said heat sink and said heat spreader have been rotatingly mated, said heat sink having two ramps with undercuts on an outer surface of opposing outer fins, said heat spreader having two substantially parallel flat sides on opposing sides of said dove-tailed edge, said two substantially parallel flat sides being substantially perpendicular to said first side and said second side of said heat spreader, said dove-tailed inner side walls of said heat sink being just wider that the distance between said two substantially parallel flatsides of said heat spreader such that said heat sink is lowered onto said heat spreader with the substantially parallel outer struts of said heat sink on either side of said two substantially parallel flat sides of said heat spreader, said heat sink is then rotated until said dove-tailed inner side walls of said heat sink and said dove-tailed edge of said heat spreader are mated;

a first clip attached to said heat sink and at least one of said two substantially parallel flatsides of said heat spreader, said first clip securing said heat sink and said heat spreader against rotational movement after said heat sink and said heat spreader have been rotatingly mated;

a fan mounted on a top surface of said fins of said heat sink; and a second clip, said second clip securing said fan to said heat sink by attaching under said two undercuts of said opposing outer fins of said heat sink such that said fan is fixedly attached to said heat sink.

9. A method of manufacturing a heat sink assembly for dissipating heat from an integrated circuit device having a package, said method comprising the following steps:

(a) mounting a heat spreader with a dove-tailed edge to said integrated circuit package;

(b) mounting a heat sink to said heat spreader, said heat sink having a first side with fins extending therefrom and a second side with two substantially parallel outer struts with dove-tailed inner side walls that matingly correspond with the dove-tailed edge of said heat spreader, said heat sink having two ramps with undercuts on an outer surface of opposing outer fins, said heat spreader having two substantially parallel flatsides on opposing sides of said dove-tailed edge, said dove-tailed inner side walls of said heat sink being just wider than the distance between said two substantially parallel flat sides of said heat spreader such that said heat sink is lowered onto said heat spreader with the substantially parallel outer struts of said heat sink on either side of said two substantially parallel flat sides of said heat spreader;

(c) rotating said heat sink until said dove-tailed inner side walls of said heat sink and said dove-tailed edge of said heat spreader are snugly mated;

(d) securing a first clip to said heat sink and at least one of said two substantially parallel flat sides of said heat spreader such that said heat sink is secured against rotational movement;

(e) mounting a fan on a top surface of said heat sink; and (f) securing a second clip to said two undercuts on said outer fins of said heat sink such that said fan is fixedly attached to said heat sink.

* * * * *